United States Patent [19]

Tischer

[11] Patent Number: 4,920,329

[45] Date of Patent: Apr. 24, 1990

[54] IMPEDANCE-COMPENSATED THICK-FILM RESISTOR

[75] Inventor: John M. Tischer, Streamwood, Ill.

[73] Assignee: Motorola, Inc., Schaumburg, Ill.

[21] Appl. No.: 406,661

[22] Filed: Sep. 13, 1989

[51] Int. Cl.$^5$ .................... H01C 3/00; H01C 1/012
[52] U.S. Cl. .................................. 338/333; 338/306; 338/334
[58] Field of Search ............... 338/333, 334, 306, 307, 338/308, 309, 314, 60, 61, 9

[56] References Cited

U.S. PATENT DOCUMENTS

| | | | |
|---|---|---|---|
| 3,781,610 | 12/1973 | Bodway | 338/334 X |
| 3,895,272 | 7/1975 | Smolko et al. | 338/334 X |
| 4,464,646 | 8/1984 | Burger et al. | 338/334 X |
| 4,503,418 | 3/1985 | Belopolsky | 338/309 |
| 4,766,411 | 8/1988 | Prieto et al. | 338/306 |

Primary Examiner—Bruce A. Reynolds
Assistant Examiner—M. M. Lateef
Attorney, Agent, or Firm—Wayne J. Egan

[57] ABSTRACT

A thick film resistor (TFR) is provided that is capable of being compensated for impedance variations related to the TFR laser-trimming process. According to the invention, a thick film capacitor (TFC) metallization is provided in parallel with the thick film to compensate the RF impedance. A method is also provided for calculating the exact length of the TFC metallization necessary to compensate the RF impedance. Once this length (L) is known, the TFC metallization can be laser-trimmed to obtain the desired length.

4 Claims, 2 Drawing Sheets

FIG.1
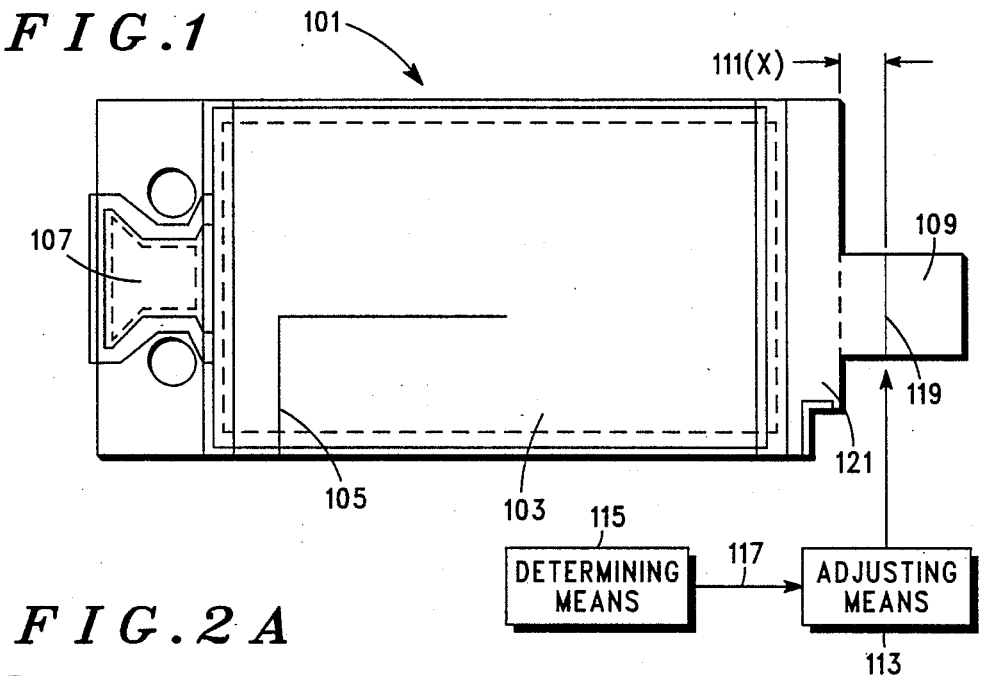
FIG.2A
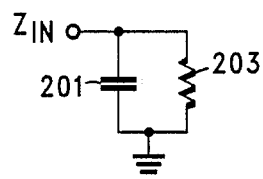
FIG.2B
| UNIT No. | R | C |
|---|---|---|
| 1 | 50 Ω | 4.1 pf |
| 2 | 50 Ω | 6.2 pf |
| 3 | 50 Ω | 5.4 pf |
FIG.2C
| f(MHz) | UNIT No.1 (Ω) | UNIT No.2 (Ω) | UNIT No.3 (Ω) |
|---|---|---|---|
| 435 | 43.6 | 38.1 | 40.2 |
| 445 | 43.4 | 37.8 | 39.9 |
| 455 | 43.1 | 37.4 | 39.6 |
| 465 | 42.9 | 37.1 | 39.3 |
| 475 | 42.7 | 36.1 | 38.9 |
FIG.2D
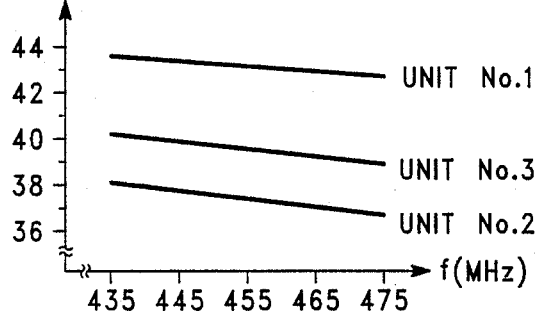

FIG. 3A
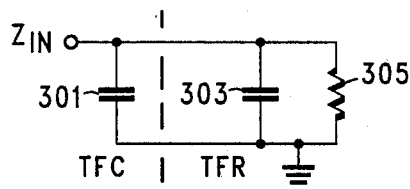
FIG. 3B
| UNIT No. | R | $C_1+C_2=C_{TOTAL}$ |
|---|---|---|
| 1' | 50 Ω | 5.4 pf |
| 2' | 50 Ω | 5.3 pf |
| 3' | 50 Ω | 5.45 pf |
FIG. 3C
| f(MHz) | UNIT No.1' $Z_{IN}$ (Ω) | UNIT No.2' (Ω) | UNIT No.3' (Ω) |
|---|---|---|---|
| 435 | 40.2 | 40.5 | 40.1 |
| 445 | 39.9 | 40.2 | 39.8 |
| 455 | 39.6 | 39.9 | 39.4 |
| 465 | 39.3 | 39.5 | 39.1 |
| 475 | 38.9 | 39.2 | 38.8 |
FIG. 3D
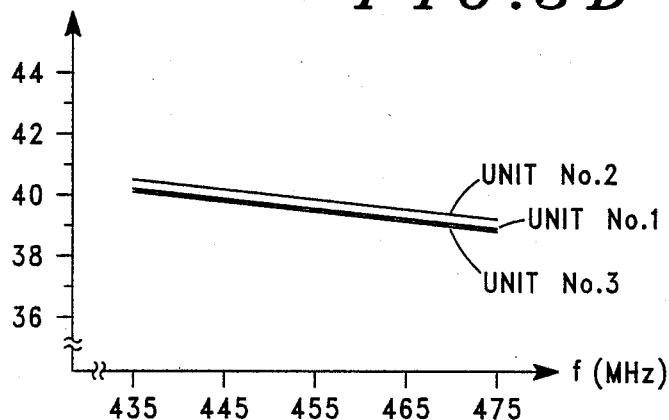

IMPEDANCE-COMPENSATED THICK-FILM RESISTOR

TECHNICAL FIELD

This application relates to thick-film resistors and more particularly to a method for compensating the impedance of a thick film resistor.

BACKGROUND OF THE INVENTION

Thick film resistor (TFR) manufacturing technology is known. Due to material and process variations, TFRs cannot be screened and fired to a desired value. To overcome this problem, the resistors are screened and fired to an initial value ($R_{fired}$) than the desired value. A laser then cuts into the resistive material to increase the effective resistance to the desired value ($R_{effective}$). Since the value $R_{fired}$ can vary, the length of the laser cut varies accordingly.

At lower frequencies the length of the laser cut is not a factor in the frequency-response of the TFR. As a result, only the final $R_{effective}$ is significant.

At radio frequencies, however, the length of the laser cut becomes a factor in the frequency-response of the TFR. As is known, this is because the electric field distribution in the TFR is a function of the length and geometry of the laser cut. As a result, the reactive part of the TFR's input impedance ($Z_{in}$) varies with the changes in the electric field distribution.

The foregoing may be understood with reference to FIGS. 2A-2D.

In FIG. 2A there is shown an equivalent circuit of a TFR. As shown, the model consists of a resistor 203 and also a capacitor 201. Here $Z_{in}$ may be represented by a resistive component (associated with resistor 203) and a reactive component (associated with capacitor 201). Obviously, at lower frequencies only the resistor 203 is significant, while at RF frequencies the capacitor 201 becomes increasingly significant.

In FIG. 2B there is a table showing test values for three different TFRs, identified as Units 1-3. As shown, all units 1-3 have identical resistive values (corresponding to resistor 203 in the FIG. 2A model) of fifty (50) ohms. However, the capacitance values (corresponding to capacitor 201 in the FIG. 2A model) are not identical and vary for each unit. Note the various values of 4.1, 6.2, and 5.4 pF. It will be appreciated that at low frequencies the capacitive reactance is negligible and, as a result, units 1-3 have identical 50-ohm impedances.

In FIG. 2C there is a table showing the magnitude of $Z_{in}$, or $|Z_{in}|$, for the RF frequency band 435-475 MHz. As shown, the impedances for units 1-3 vary significantly, from 38-44 ohms. The variation is all the more significant when it is recalled that all units had identical 50-ohm impedances at low frequencies. It will be appreciated that the variations in performance seen at the RF frequencies is due to the fact that units 1-3 have differing values of capacitance (corresponding to capacitor 201 in FIG. 2A). This, of course, is related to the fact that the laser cut in each unit 1-3 is slightly different in length and geometry.

In FIG. 2D there is a graphical representation of the table shown in FIG. 2C. Note the variations in each plot (or curve) representing the $|Z_{in}|$ for each unit 1-3.

As a result, it would be desirable to produce a thick film resistor capable of being compensated for these variations in impedance at RF frequencies.

SUMMARY OF THE INVENTION

It is an object of the invention to produce a thick film resistor capable of being compensated for variations in impedance related to the laser-trimming process. Accordingly, an impedance-compensated thick film resistor (TFR) is provided. According to the invention, a thick film capacitor (TFC) metallization is provided in parallel with the thick film resistor to compensate the RF impedance. A method is also provided for calculating the exact length of the TFC metallization necessary to compensate the RF impedance. Once this length (X) is known, the TFC metallization can be laser-trimmed to obtain the desired length.

BRIEF DESCRIPTION OF THE DRAWINGS

FIG. 1 is a block diagram that shows a first embodiment of an impedance-compensated thick film resistor, according to the invention.

FIGS. 2A-2D show the performance of several typical thick film resistor units (designated 1, 2, 3) as in the prior art.

FIGS. 3A-3D show the performance of several impedance-compensated thick film resistor units (designated 1', 2', 3') according to the present invention.

DETAILED DESCRIPTION OF THE INVENTION

Referring now to FIG. 1, there is shown a TFR 101 having a screened area 103 and laser cut 105. The TFR also has a first terminal 107 and a second terminal 121. The second terminal 121 is attached to a capacitor metallization area 109. It will be appreciated that the metallization area 109 may form a compensating capacitor of a suitable value. For this purpose, the capacitor formed by metallization area 109 may be trimmed by adjusting its length. This length adjustment of metallization area 109 may be accomplished by providing a cut 119 via a laser or other suitable length-adjusting means 113.

Obviously, the problem of installing a suitable cut 119 in the metallization area 109 is equivalent to determining the desired position 111 (or "X") of the cut 119. The applicant has discovered a method for mathematically determining the desired point (X) of the metallization 119 at which to sever or cut it, thereby resulting in the desired impedance compensation. The equations below describe this method:

The following equation 1 defines the relationship of $R_{fired}$ to the effective capacitance of the TFR ($C_{TFR}$) after laser trim:

$$C_{TFR} = K_1 + K_2 * R_{fired}, \qquad (1)$$

where $K_1$ = the TFR's fixed capacitance and $K_2$ = the TFR's capacitance slope.

The following equation 2 defines the relationship of the capacitance of the TFC ($C_{TFC}$) to its length (X):

$$C_{TFC} = K_3 * X, \qquad (2)$$

where $K_3$ = the TFC's slope.

The following equation 3 expresses the requirement that the sum of the two effective capacitances ($C_{TFR} + C_{TFC}$) must equal a constant ($\beta$) to have a substantially uniform or unchanging impedance:

$$K_1 + K_2 * R_{fired} + K_3 * X = \beta \qquad (3)$$

The following equation 4 may be obtained by algebraically solving equation 3 for the location X where the TFC should be laser cut:

$$X = (\beta - K_1 - K_2 * R_{fired})/K_3 \quad (4)$$

It should be obvious to one skilled in the art that the determining means 115 may comprise a microprocessor that is suitably-programmed to compute X in accordance with equation 4, above. Having done so, the determining means 115 may transmit X to the adjusting means 113. The adjusting means 113, of course, may consist of a suitable laser trimming device that is arranged to cut the TFC metallization at the appropriate location 111.

The following example is instructive:

Assume that a compensated TFR screened on a ceramic of thickness D and dielectric constant ER is desired to have an $R_{effective}$ equal to 250 ohms and a $C_{effective}$ equal to 7.0 pF ($\beta$ = 7.0 pF). Experimental data on an uncompensated 250 ohm TFR shows fixed capacitance due to the terminals equal to 1.0 pF ($K_1$ = 1.0 pF). The fired value of the resistor ($R_{fired}$) varies from 150 ohms to 225 ohms. Experimental data also shows a 0.022 pF increase in the uncompensated TFR's effective capacitance per a one ohm increase in $R_{fired}$ ($K_2$ = 0.022 pF/ohm). A suitable geometry of TFC is selected so it can compensate the TFR for the range of $R_{fired}$. To determine the maximum capacitance of the TFC needed equation (4) must be written as follows:

$$X*K_3 = \beta - K_1 - K_2*R_{fired} = C_{TFC}.$$

The maximum value of the TFC occurs when $R_{fired}$ is at its minimum value of 150 ohms. Hence:

$$C_{TFC}(Max) = 7.0 \text{ pF} - 10 \text{ pF} - (.022 \text{ pF/ohm})*150 \text{ ohm}$$
$$= 2.7 \text{ pF}.$$

The geometry of the TFC is made so that at the TFCs maximum length its capacitance is equal to 2.7 pF. The maximum length is set to 0.5 cm. From this the width of the TFC is adjusted so $K_3$ equals 5.4 pF/cm. All of the constants for the compensated TFR are known and may be implemented in the resistor's trim program.

$K_1 = 1 \, pF;$ $K_2 = 0.022 \, pF/ohm;$ $K_3 = 5.4 \, pF/cm;$ and, $\beta = 7 \, pF.$ The resistor trim program would read the value $R_{fired}$ and would compute the distance (X) whereat to cut the TFC:

$$X = [7 - 1 - (0.022)*R_{fired}]/5.4 \text{ cm}.$$

If $R_{fired}$ were equal to 150 ohms, then X (the cut distance) would equal 0.5 cm, leaving the TFC uncut. If $R_{fired}$ equaled 211 ohms, then the cut distance (X) would equal 0.25 cm, or 50% of the TFC would be removed.

Some benefits of the impedance-compensated thick-film resistor, according to the invention, are shown in FIGS. 3A-3D.

It will be appreciated that each of the FIGS. 3A-3D may be interpreted in view of the corresponding figure of the FIGS. 2A-2D.

In FIG. 3A there is shown an equivalent circuit of an impedance-compensated TFR, according to the invention. As shown, the TFR 101 is modelled (or represented) by a resistor 305 and capacitor 303, and the compensating TFC 109 is modelled (or represented) by a capacitor 301. Here $Z_{in}$ may be represented by a resistive component (associated with resistor 305) and a reactive component (associated with capacitors 301 and 303).

In FIG. 3B there is a table showing test values for three different impedance-compensated TFRs, identified as Units 1', 2', and 3'. Note the effective capacitances (5.4, 5.3, 5.45 pF) of the compensated units (1', 2', and 3') are essentially identical.

In FIG. 3C there is a table showing the magnitude of the resulting $Z_{in}$, or $|Z_{in}|$, for the RF frequency band 435-475 MHz. As shown, the impedances for units 1', 2', and 3' are generally constant and unchanging, grouped around 40 ohms. The uniform nature of the impedance values for the compensated units shown in FIG. 3C is all the more dramatic when compared with the corresponding impedance values for the uncompensated units shown in FIG. 2C. It will be appreciated that the improved performance here is due to the fact that the units of the present FIG. 2C have been compensated to achieve uniform (if not identical) values of effective capacitance.

FIG. 3D is a graphical representation of the table shown in FIG. 3C. Note the closely-grouped plots (or curves) representing $|Z_{in}|$ for each unit 1', 2', and 3'.

While various embodiments of an impedance-compensated thick-film resistor, according to the present invention, have been described hereinabove, the scope of the invention is defined by the following claims.

What is claimed is:

1. An impedance-compensated thick-film resistor (TFR) having at least one terminal, comprising:
a thick-film capacitor (TFC) coupled to said terminal, said TFC comprising a generally rectangular-shaped metallized portion having a length extending a finite distance (L) away from said terminal, L based at least in part on $(\beta - K_1 - K_2*R_{fired})/K_3$, where $\beta$ = the TFR's final effective capacitance, $K_1$ = the TFR's fixed capacitance, $K_2$ = the TFR's capacitance slope, $R_{fired}$ = the TFR's fired resistance, and $K_3$ = the TFC's capacitance slope.

2. A method for compensating the impedance of a thick-film resistor (TFR) having at least one terminal, the method comprising:
(a) providing a thick-film capacitor (TFC) coupled to said terminal, said TFC comprising a generally rectangular-shaped metallized portion having a length extending a finite distance (L) away from said terminal, and,
(b) determining $L' = (\beta - K_1 - K_2*R_{fired})/K_3$, where $\beta$ = the TFR's final effective capacitance, $K_1$ = the TFR's fixed capacitance, $K_2$ = the TFR's capacitance slope, $R_{fired}$ = the TFR's fired resistance, and $K_3$ = the TFC's capacitance slope; and, (c) adjusting L based at least in part on L'.

3. A method for compensating the impedance of a thick-film resistor (TFR) having at least one terminal and a thick-film capacitor (TFC) coupled thereto, said TFC comprising a generally rectangular-shaped metallized portion having a length extending a finite distance (L) away from said terminal, the method comprising:

(a) determining $L' = (\beta - K_1 - K_2 * R_{fired})/K_3$, where $\beta$ = the TFR's final effective capacitance, $K_1$ = the TFR's fixed capacitance, $K_2$ = the TFR's capacitance slope, $R_{fired}$ = the TFR's fired resistance, and $K_3$ = the TFC's capacitance slope; and, (b) adjusting L based at least in part on L'.

4. Means for compensating the impedance of a thick-film resistor (TFR) having at least one terminal and a thick-film capacitor (TFC) coupled thereto, said TFC comprising a generally rectangular-shaped metallized portion having a length extending a finite distance (L) away from said terminal, the means comprising:

means for determining $L' = (\beta - K_1 - K_2 * R_{fired})/K_3$, where $\beta$ = the TFR's final effective capacitance, $K_1$ = the TFR's fixed capacitance, $K_2$ = the TFR's capacitance slope, $R_{fired}$ = the TFR's fired resistance, and $K_3$ = the TFC's capacitance slope; and, means for adjusting L based at least in part on L'.

* * * * *